US005526317A

United States Patent [19]

McClure

[11] Patent Number: 5,526,317
[45] Date of Patent: Jun. 11, 1996

[54] STRUCTURE FOR USING A PORTION OF AN INTEGRATED CIRCUIT DIE

[75] Inventor: David C. McClure, Carrollton, Tex.

[73] Assignee: SGS-Thomson Microelectronics, Inc., Carrollton, Tex.

[21] Appl. No.: 263,048

[22] Filed: Jun. 21, 1994

Related U.S. Application Data

[63] Continuation of Ser. No. 975,628, Nov. 13, 1992, Pat. No. 5,355,344.

[51] Int. Cl.[6] .................................................. G11C 8/00
[52] U.S. Cl. ................. 365/225.7; 365/200; 365/230.08; 327/525
[58] Field of Search ................. 365/225.7, 200, 365/201, 230.08; 257/782; 327/525

[56] References Cited

U.S. PATENT DOCUMENTS 4,476,546 10/1984 Varshney ............................... 365/200
4,703,436 10/1987 Varshney ............................ 365/200 X Primary Examiner—David C. Nelms
Assistant Examiner—Huan Hoang
Attorney, Agent, or Firm—Renee M. Larson; Lisa K. Jorgenson

[57] ABSTRACT

Two addresses of an integrated circuit are selected to define a portion of the die which is functional and the portion of the die which will not be used. An input structure for addresses, which may be added to part of the electrostatic discharge (ESD) input structure of a pin, allows an address signal to be set to a predetermined logic level and to not be bonded out to the package. Additionally, another input structure allows the mapping of a signal pin to be changed. The function of a pin may need to be changed to accommodate a pinout for a different density device. This is useful when a die is put into a smaller density device package which has a pin out that does not accommodate the die. In this way, partially functional die that previously were discarded may be utilized, thereby recouping potential losses during manufacturing.

9 Claims, 1 Drawing Sheet 5,526,317

STRUCTURE FOR USING A PORTION OF AN INTEGRATED CIRCUIT DIE

This is a continuation of application Ser. No. 07/975,628, filed Nov. 13, 1992, now U.S. Pat. No. 5,355,344.

BACKGROUND OF THE INVENTION

1. Field of the Invention

The present invention relates generally to integrated circuits, and more specifically to a structure for utilizing a portion of an integrated circuit memory die.

2. Description of the Prior Art

During the manufacture of integrated circuit die, die are often discarded because a portion of the die is defective and can not be repaired at, for instance, laser repair. Even though a major portion of the die may be fully functional, it is often necessary to discard the entire die as scrap because the functional portion of the die is not recoverable. For instance, it is not uncommon to scrap a 64K SRAM die which is partially functional and could yield a 16K SRAM. Even though the 64K SRAM could be used as a smaller 16K SRAM device, it must be scrapped if there is no plausible method to recover the functional portion.

Another concern with using partially functional die as effectively smaller die is whether the die will fit into a package designed for a smaller die. Further, even if the die does fit, there is also concern that the package pinout may not accommodate the signal mapping of the die. For instance, pin number 27 on a 28 pin DIP package for a typical 64K SRAM may be the Write Enable pin. However, the equivalent pin on a 16K SRAM may be an Address pin. Specifically, some 16K SRAM packages would have a pin other than pin 23 as the equivalent Address pin on a 24 pin DIP. If the 64K SRAM die is fitted into the package of the 16K SRAM, there will be mapping problems, because the Write Enable signal of the die is mapped to an Address pin on the 16K SRAM package.

SUMMARY OF THE INVENTION

It would be advantageous in the art to be able to use a portion of an integrated circuit die. For example, a portion of a die could be used for a smaller density device if the die will fit into the smaller density device package.

Therefore, according to the present invention, two addresses of the integrated circuit are selected to define a portion of the die which is functional and the portion of the die which will not be used. An input structure for addresses, which may be added to part of the electrostatic discharge (ESD) input structure of a pin, allows an address signal to be set to a predetermined logic level and to not be bonded out to the package. Additionally, another input structure allows the mapping of a signal pin to be changed. The function of a pin may need to be changed to accommodate a pinout for a different density device. This is useful when a die is put into a smaller density device package which has a pin out that does not accommodate the die. In this way, partially functional die that previously were discarded may be utilized, thereby recouping potential losses during manufacturing.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

When manufacturing semiconductor die, it is a common problem in the industry to experience a decrease in yield because a portion of the integrated circuit memory array will be faulty. As an example, a 64K SRAM device may be partially functional but not fully functional so as to render a 64K SRAM. Practice, common in the semiconductor industry today, is to treat the entire die as unusable and discard the die. This, of course, leads to scrapping die which could still be useful if the portion of the memory array which does work could be salvaged. According to the present invention, the desired portion of the die is selected by properly choosing two address pins which define the portion of the die which is not functional, setting them to a desired logic level, and not bonding them to their package pins. These two address pins are not needed when utilizing a certain size memory array as a smaller density device. The portion of the memory which is functional could be used as a 16K SRAM assuming the 64K SRAM die could fit into a 16K SRAM package.

Figure 1:
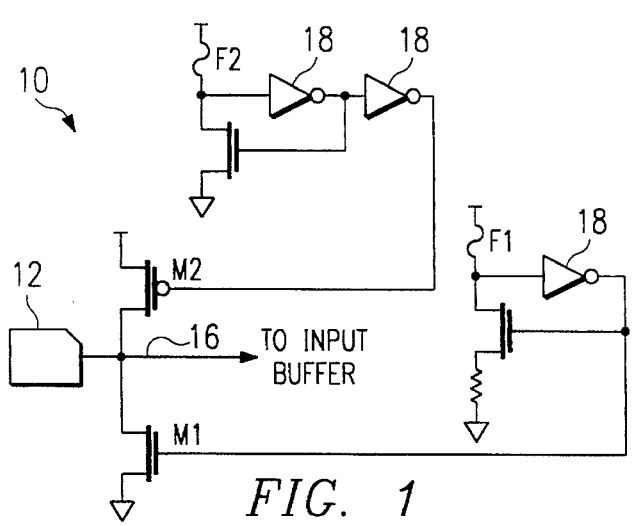
FIG. 1 is a schematic of an address input ESD structure according to the present invention.

FIG. 1 shows a schematic of an address signal input ESD structure according to the present invention. The input ESD structure 10 of address pad 12 allows that particular address pad to be set to one of two logic states. The input ESD structure of the address pad shown is basically composed of two transistors, M1 and M2, which are each electrically connected to a fuse. N-Channel transistor M1 is connected to ground and is electrically connected through inverter 18 to fuse F1 which in turn is connected to the main supply voltage. Likewise, P-Channel transistor M2 is electrically connected to the supply voltage through two inverters 18 and to fuse F2 which is also tied to the supply voltage. Typically, for CMOS, the supply voltage is 5 volts.

When neither fuse F1 nor F2 is blown, transistors M1 and M2 act as normal electrostatic discharge (ESD) protection devices and are off. This is the normal mode for an address pin for a fully functional device. However, when either fuse F1 or F2 is blown, the address pad is held to a logic level determined by which fuse is blown, and input ESD structure 10 no longer acts as ESD protection for the address pad 12. This is permissible since address pad 12 of the address signal will not be bonded to the integrated circuit package. For the input ESD structure shown in FIG. 1, when fuse F1 is blown, M1 is turned on and the address pad is pulled down to a logic low level; likewise, when fuse F2 is blown, M2 is on and the address pad is pulled up to a logic high level. In this way, address pad 12 is set to the desired logic state simply by blowing the appropriate fuse. When two address signals are chosen to define a portion of the die which is not functional, the address pin pads may be marked to be easily identified so that they will be set to a logic level and not bonded to the package. The address pad 12 may be marked so that it is not bonded out to the package of the integrated circuit.

Figure 2:
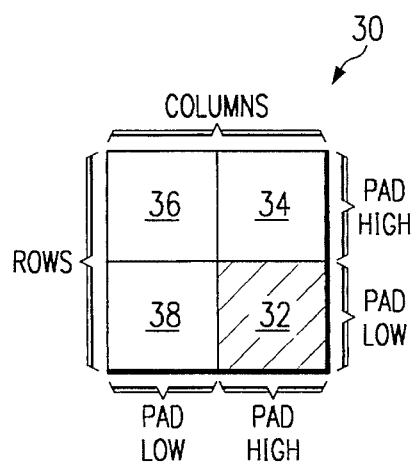
FIG. 2 is a block diagram of a memory array according to the present invention.

FIG. 2 shows a block diagram of a memory array according to the present invention. Memory array 30 has four quadrants of memory 32, 34, 36, and 38 which are defined by a number of columns and a number of rows. As shown in FIG. 2, quadrant 32 is chosen by setting two address pads to the appropriate value; one address pad is set low while the other address pad is set high. For the memory array 30 shown in FIG. 2, one-fourth of the memory array, quadrant 32, is chosen by setting the column pad of quadrant 32 high and the row pad of quadrant 32 low. For instance, in the case of a fast 64K SRAM, one-fourth of the 64K SRAM die could be utilized as a fully functional 16K SRAM. Or, 256K SRAM devices could be utilized as 64K SRAM devices.

In the case of a partially functional 64K SRAM die, the usable portion of the memory array can be used as a 16K SRAM using the method shown above. However, the 64K die must fit inside the 16K SRAM package and it must have a signal pinout which is accommodated by the pinout of the 16K SRAM package. If the die of the 64K SRAM will fit inside the physical package of the 16K, then the device could be used as a 16K device. This is a marked improvement over the prior art where the die would have been discarded as a die which is unusable.

Sometimes in order to use the functional portion of a partially functional die as described above, it may be necessary to fit the die into a smaller package with different pinout configuration than for what it was designed. The die will work if the die will fit into the smaller package and the smaller package can accommodate the necessary pinout configuration needed by the larger die. As progression is made to a smaller density memory, some address pins on the device will not be utilized and the configuration of the pinout may not be the same. This is not a problem if the smaller package can still accommodate the physically larger die and the pinout needed by it. With current memory sizes and packages, for instance, a 64K×1 SRAM die can fit into some 16K×1 device packages. Likewise, the 16K×4 (64K) SRAM die can fit into a typical 4K×4 (16K) device package. In some cases, however, it may be a problem for some larger die to be placed into the package of a smaller density device because the package pinout of the smaller package may be different from the package the die was designed to fit into. For instance, some current package pinout configurations for 2K×8 (16K) SRAMs would not accommodate the needed pinout for some 8K×8 (64K) SRAMs.

Figure 3:
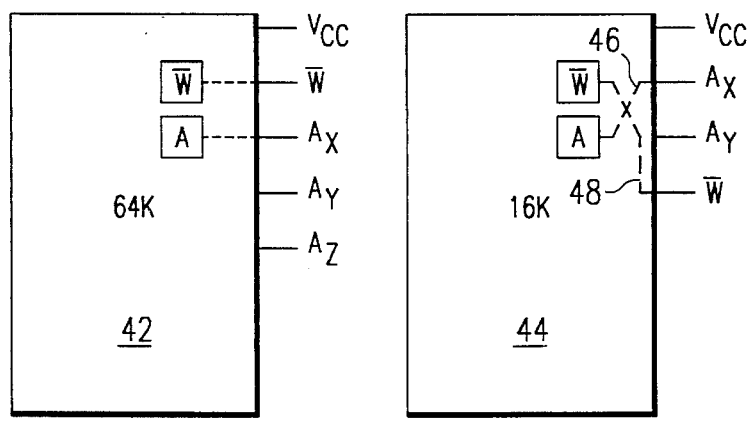
FIG. 3 is a block diagram which shows how to reverse the mapping between two pins internal to the integrated circuit according to the present invention.

FIG. 3 shows a block diagram 40 which demonstrates how to reverse the mapping between two pins internal to an integrated circuit package. Two different integrated circuits 42 and 44 are shown. Package 42 is a typical 64K SRAM package currently on the market whereas package 44 is a typical 16K SRAM package. The upper right corner of package 42 has pins Vcc, W, Ax, Ay, and Az as shown in FIG. 3. The order of these signal pins is different from the 16K package. Starting with the right uppermost pin of package 44, the Vcc pin is followed in order by Ax, Ay, and W. The location of pins Ax and W on package 42 is different than that shown for package 44. In order to successfully house a 64K die into a 16K package, it is necessary to swap the order of the Ax and W signal pads on the 64K die. Reversing the mapping of two address pads is accomplished through the use of an additional multiplexer in the input structure as shown in FIG. 4.

Figure 4:
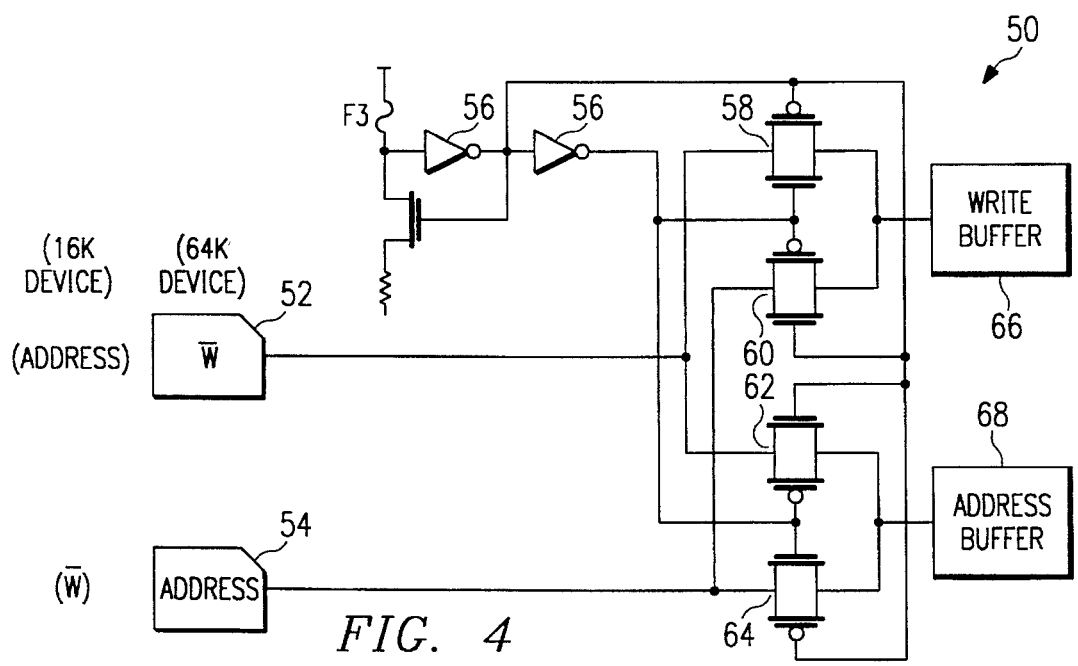
FIG. 4 is a schematic of two signal input ESD structures illustrating reverse mapping of two input signals according to the present invention.

FIG. 4 shows a schematic 50 of two signal input structures which allow reverse mapping of the two signals. When downsizing the 64K SRAM die to the 16K SRAM die, the location of the W and Address pins are swapped. In order to be able to put the 64K die into the 16K package it is first necessary to reverse map the locations of these two pins to their respective buffer circuits, Write Buffer 66 and Address Buffer 68. Pad 52 (Write Enable) and pad 54 (Address) are the two signals to be reverse mapped inside the 64K SRAM. Gates 58, 60, 62, and 64 define the multiplexer circuitry needed to reverse the mapping of the two signals. Blowing fuse F3 reverses the mapping of pad to buffer between pad 52 (Write Enable) and pad 54 (Address). After blowing fuse F3, pad 52 (Write Enable) is mapped to Address Buffer 68 and pad 54 (Address) is mapped to Write Buffer 66.

Therefore, a technique has been described for using only a portion of an integrated memory circuit die. In many instances it would be preferable to use only a portion of a memory array. The present invention describes two special input circuits which can be utilized to define and use an effectively smaller portion of a memory array. The first input circuit allows address signal pads to be identified and then not bonded to the die package, thereby selecting a desired portion of the memory array. The second input circuit allows the functionality of a signal pad to be changed. This may be necessary when fitting a die into a smaller density device package which does not accommodate the functionality of the die pinout.

While the invention has been particularly shown and described with reference to a preferred embodiment, it will be understood by those skilled in the art that various changes in form and detail may be made therein without departing from the spirit and scope of the invention. For instance, the input ESD structure 10 shown in FIG. 1 is just an example. Transistors M1 and M2 of FIG. 1 constitute one type of input ESD structure of a pin; the other circuitry has been added to M1 and M2 to work in conjunction with the input ESD structure. However, the circuitry could be embodied in myriad other ways. Also, the circuitry shown in FIG. 4 is not the only means available to reverse the mapping between two pins. Various other forms of logic could be used to accomplish reverse mapping.

What is claimed is:

1. A memory integrated circuit die wherein only a portion of the memory array is utilized, comprising:

a memory matrix, having a plurality of columns and a plurality of rows;

a plurality of address signal pads, wherein each address signal pad of the plurality of address signal pads has an input circuitry for setting the address signal pad to a desired logic level and wherein the input circuitry is capable of functioning as an electrostatic discharge (ESD) protection circuit; and means for selecting a desired portion of the memory matrix to be addressed by the address signal pads for use as a smaller density device, by selecting a first address signal pad and a second address signal pad of the plurality of address signal pads to point to the desired portion of the memory matrix and not bonding the first address signal pad and the second address signal pad to a die package of the memory integrated circuit die.

2. The die of claim 1, wherein the input circuitry is comprised of a first transistor connected to a first predetermined voltage and a second transistor connected to a second predetermined voltage, with a node connecting the first transistor to the second transistor operably connected to an input buffer circuitry, and whereby the first transistor is operably connected to a means for setting the first transistor to a predetermined logic level and the second transistor is operably connected to a means for setting the second transistor to a predetermined logic level.

3. The die of claim 1, wherein the means for setting the first transistor to a predetermined logic level is a first fuse and the means for setting the second transistor to a predetermined logic level is a second fuse.

4. The die of claim 3, wherein the address signal pad is set to a first logic state by blowing the first fuse and is set to a second logic state by blowing the second fuse.

5. The die of claim 4, wherein only one of the first fuse and the second fuse may be blown.

6. The die of claim 4, wherein the first logic state is equal to a logic low level and the second logic state is equal to a logic high level.

7. The die of claim 6, wherein when the first fuse is blown the address signal pad is equal to a logic low level and when the second fuse is blown the address signal pad is equal to a logic high level.

8. The die of claim 2, wherein the address signal pad is to be normally bonded to the package housing the integrated circuit die, and the first fuse and the second fuse will not be blown.

9. The die of claim 8, wherein the first transistor and the second transistor of the input circuitry function to provide ESD protection.

\* \* \* \* \*